Figure 1:
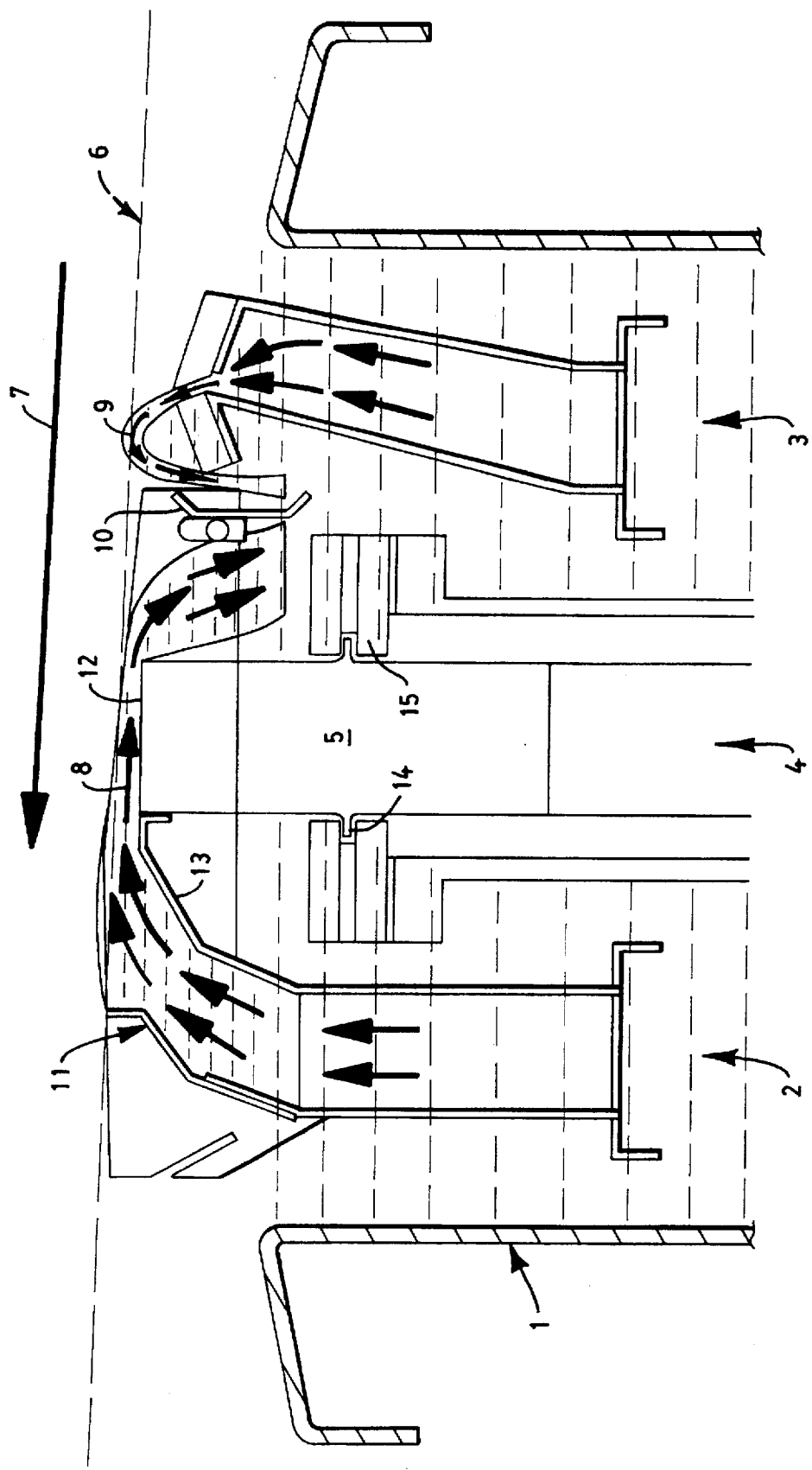

United States Patent [19]
Garrecht

[11] Patent Number: 5,762,257
[45] Date of Patent: Jun. 9, 1998

[54] DEVICE FOR FLUX-FREE SOLDERING

[75] Inventor: Ewald Garrecht, Wertheim, Germany

[73] Assignee: ERSA Löttechnik GmbH, Wertheim, Germany

[21] Appl. No.: 520,483

[22] Filed: Aug. 29, 1995

[30] Foreign Application Priority Data

Aug. 30, 1994 [DE] Germany ............ 44 32 402.2

[51] Int. Cl.⁶ ................ H05K 3/34; B23K 3/06
[52] U.S. Cl. ............ 228/56.2; 228/37; 228/262; 118/429
[58] Field of Search .......... 228/56.2, 37, 262; 118/429, 612; 427/600, 601

[56] References Cited

U.S. PATENT DOCUMENTS

| | | |
|---|---|---|
| 3,266,136 | 8/1966 | Gutbier . |
| 3,303,983 | 2/1967 | Patrick et al. . |
| 3,536,243 | 10/1970 | Higgins . |
| 3,762,368 | 10/1973 | Strube et al. ............ 118/429 |
| 3,966,110 | 6/1976 | Boynton ................ 228/262 |
| 5,228,614 | 7/1993 | Elliot et al. . |

FOREIGN PATENT DOCUMENTS

| | | |
|---|---|---|
| 32 18 338 | 11/1983 | Germany . |
| 3218388A1 | 11/1983 | Germany . |

OTHER PUBLICATIONS

"Fluxloses Ultraschall–Lötsystem" (Sales Brochure).
R. J. Klein Wassink 1991 Weichlöten in der Elecktrotechnik.

*Primary Examiner*—Samuel M. Heinrich
*Attorney, Agent, or Firm*—McGlew and Tuttle

[57] ABSTRACT

The present invention pertains to a device for the flux-free soldering of printed circuit boards guided over the soldering wave of a wave soldering nozzle, wherein the solder is vibrated by means of at least one ultrasonic electrode (sonotrode), the surface of the sonotrode is directly rinsed by the soldering wave, and the printed circuit boards are guided just above the surface of the sonotrode. It is provided that the surface (12, 28) of the sonotrode (5, 21) forms at least a partial area of the surface of the wave former (11, 13) of the wave soldering nozzle (2, 22).

12 Claims, 3 Drawing Sheets

DEVICE FOR FLUX-FREE SOLDERING

The present invention pertains to a device for the flux-free soldering of printed circuit boards guided above the soldering wave of a wave soldering nozzle, wherein the solder is induced to vibrate by means of an ultrasonic electrode (sonotrode), the surface of the sonotrode is directly rinsed by the soldering wave, and the printed circuit boards are guided just above the surface of the sonotrode.

A device of this class has been known from a prospectus of ASAHI GLASS Company entitled "Flux-free Ultrasonic Soldering System, page 9. The sonotrode of an ultrasonic oscillator is located within a soldering bath container here, and it forms the middle part of a wave soldering nozzle, wherein the molten solder is pumped up on opposite sides of the sonotrode to form a soldering wave above the sonotrode. The parts to be soldered are moved above the surface of the molten soldering wave or dipped vertically into same, while the part to be processed is moved farther horizontally. It has also been known that by using ultrasonic vibrations in the area of the parts to be soldered together, good cleaning and wetting of the surfaces of the parts to be soldered together takes place, without a flux having been applied beforehand to the soldered joints of the points to be soldered together.

A wave soldering device, in which the sonotrode is arranged under the wave former of the soldering nozzle, has been known from DE 32 18 338 A1. However, the ultrasonic vibrations of the sonotrode cannot act here optimally on the soldered joints, because only the wave former is subjected to the ultrasonic vibration.

The basic object of the present invention is therefore to provide a device for flux-free soldering of this class, with which the industrial soldering of printed circuit boards is essentially improved.

To accomplish this object, the present invention provides for the surface of the sonotrode forming at least a partial area of the surface of the wave former of the wave soldering nozzle. The surface of the sonotrode, being a component of the wave former itself, is in direct contact with the hot soldering wave guided over the wave former, from which [follows—German original incorrect—Tr.Ed.] the direct action of the vibrations of the ultrasound of the sonotrode on the soldering wave and consequently on the soldered joints dipped into same [the soldering wave] for soldering. The soldering wave is not cooled at the sonotrode, because the sonotrode is heated to the temperature of the soldering bath. Thus, the soldering takes place at constant soldering bath temperature. The length and the shape of the sonotrode in the direction of the soldering wave determines the shape of the wave and its rate of flow. Thus, the surface of the sonotrode, which is part of the wave former, acts directly on the soldering wave and consequently on the soldered joints of the parts to be soldered together. Thus, the sonotrode is in the area of direct action on the directed flow of the soldering wave, into which the parts of the printed circuit boards being moved past, which are to be soldered, dip just above the sonotrode. The ultrasonic vibrations of the sonotrode can thus bring about a good cleaning and wetting of the surfaces of the parts to be soldered together, which is essential for the industrial soldering of printed circuit boards. As a result, pretreatment of the parts to be soldered together by spraying on flux is no longer necessary, so that an industrial soldering device designed according to the present invention can be made substantially more compact, and it is very environmentally friendly, because no other pretreatment of the soldered joints is necessary to obtain metallically pure soldering surfaces. The cleaning and the soldering of the soldered joints are combined in the device according to the present invention.

In another variant of the present invention, the surface of the sonotrode forms an essentially horizontal end area of the guiding plate of a wave soldering nozzle. It is achieved as a result that the sonotrode is arranged constructively precisely where the soldering of the soldered joints takes place. In another variant of the present invention, the surface of the sonotrode is inclined by a small angle in relation to the horizontal at least partially in the direction of flow of the solder. This design of the surface of the sonotrode determines the shape of the soldering wave and its rate of flow. In another variant of the present invention, to form or guide the soldering wave, the surface of the sonotrode is provided with slots, which are able to bring about, e.g., a lateral spread of the soldering wave.

The mounting point of the sonotrode mounted in the solder container is arranged according to the present invention in a node of the ultrasonic vibration in order to allow the ultrasonic vibrations to act specifically on the soldering wave and not to allow any action of the ultrasonic vibration on the container itself. It is also provided for the industrial soldering of printed circuit boards that a plurality of sonotrodes are arranged next to each other over the width of the solder container. The great width of a wave soldering nozzle necessary for the industrial soldering can be provided with a sonotrode unit as a result. To do so, the surface of the sonotrodes has a rectangular cross section, and the sonotrodes are arranged at closely spaced locations next to each other, and the sonotrodes have reduced cross sections under their surface on opposite sides, and the mounting points of the sonotrodes are accommodated in the area of reduced cross section between two sonotrodes mutually abutting each other. This makes possible the individual mounting of each of the sonotrodes arranged next to each other in the solder container.

Finally, the ultrasonic vibrations of the sonotrodes can be switched on at intervals in order to bring about an even better wetting and filling of the cylindrical cavities of a printed circuit board based on the principle of capillarity, and even longer cavities and cavities of smaller diameter can be filled with solder.

In another variant, the flow of solder is guided through the sonotrode to form a mini-soldering wave, and the surface of the sonotrode forms the guiding surface for the solder flow. Such a device is used for the partial soldering of printed circuit boards, especially for the purpose of the repair or replacement of components. The sonotrode is designed as a ring nozzle, wherein the angular or ring-shaped edge area of the solder discharge opening forms the guiding surface for the solder flow. The ring nozzle forms a replaceable part of the sonotrode in order to make solder waves of different shapes available for repair soldering.

Figure 2:
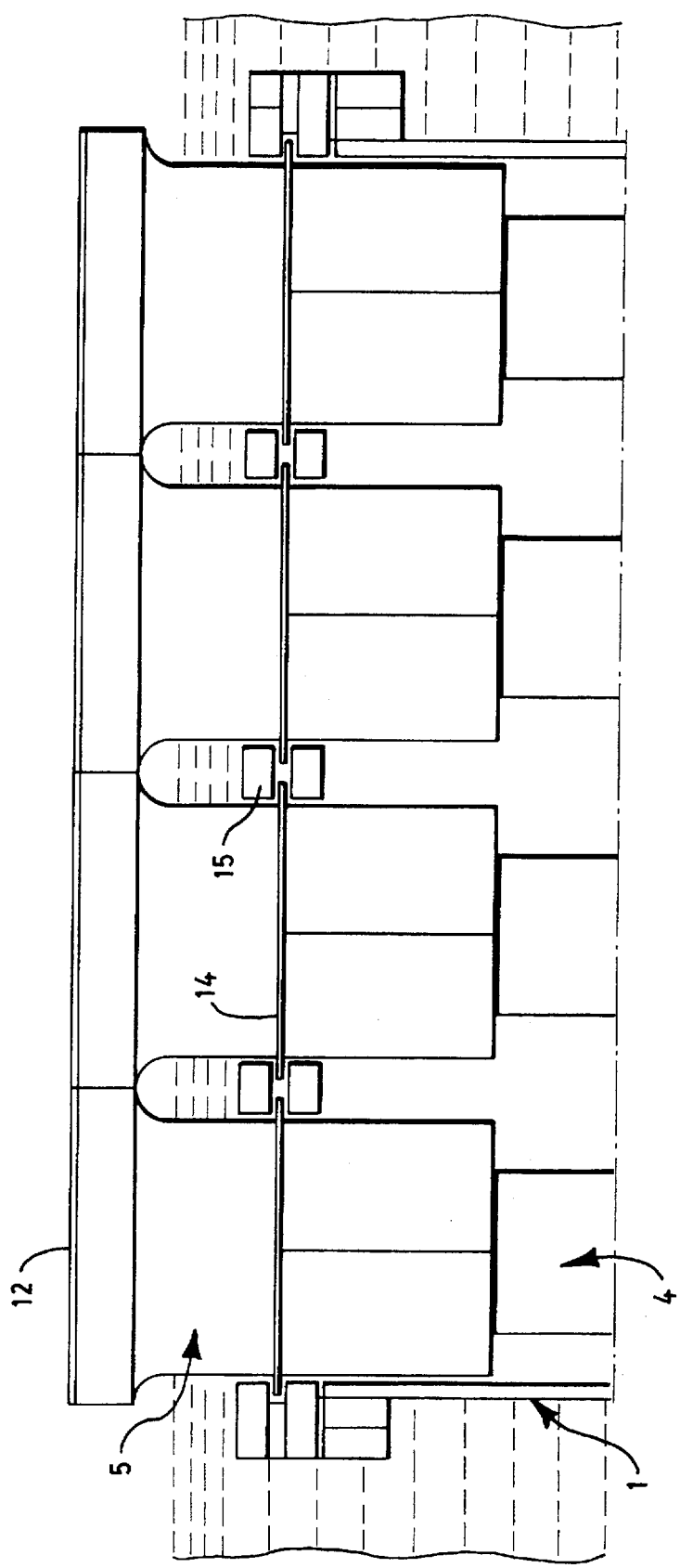
Figure 3:
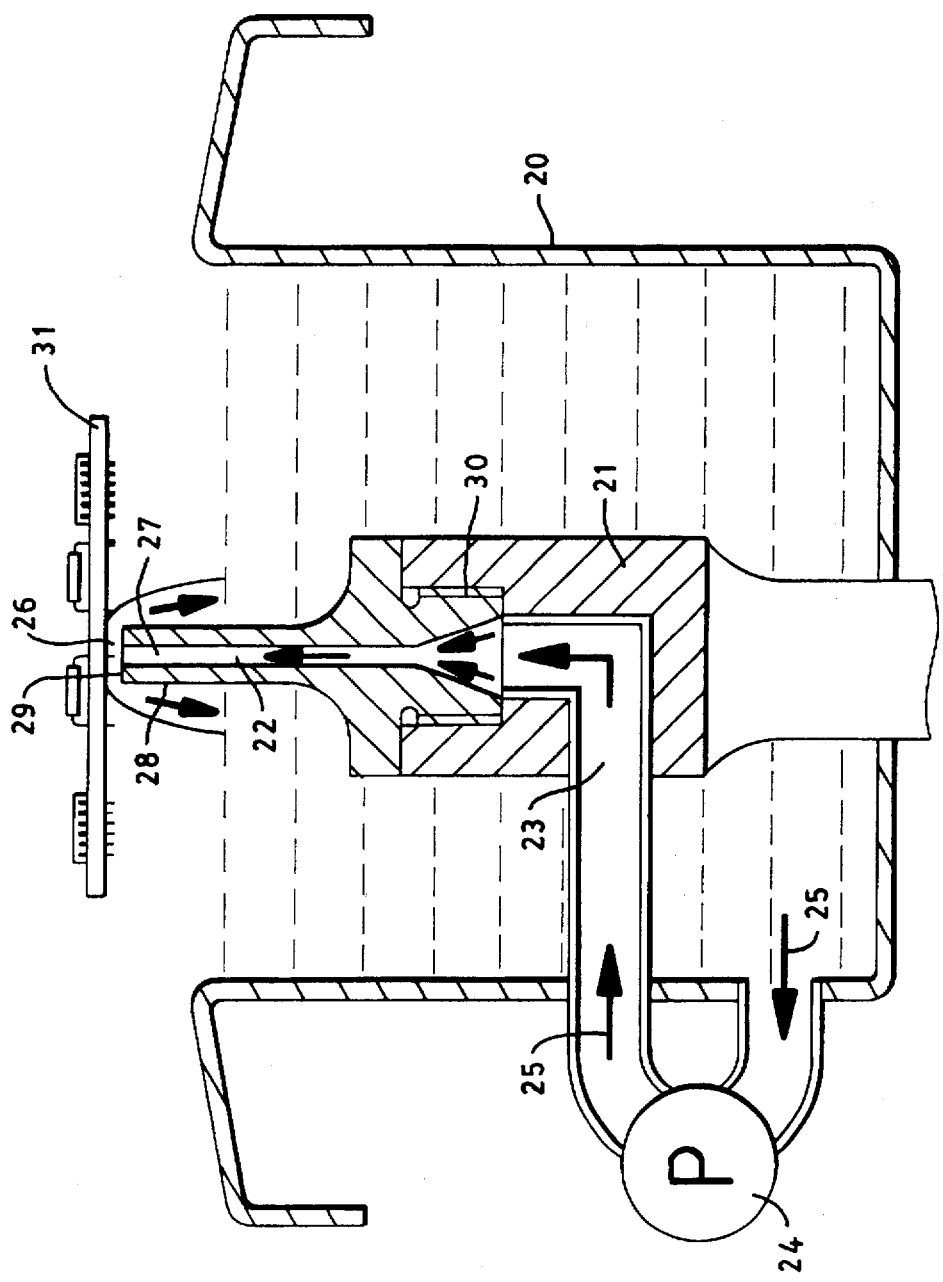

The present invention will be explained in greater detail below on the basis of two exemplary embodiments of devices for flux-free soldering, which are represented in the drawings in detail. In the drawings, FIG. 1 shows a schematic longitudinal section through the device in the operating state, FIG. 2 shows a cross section through the device in the area of the sonotrodes, and FIG. 3 shows a cross section through the second exemplary embodiment as a mini-soldering wave.

The device for flux-free soldering comprises a heatable solder container 1, two soldering nozzles 2, 3, and four ultrasonic electrodes 4 arranged next to each other with the sonotrodes 5 belonging to them. A conveyor belt 6 for the printed circuit boards provided with parts to be soldered together, which are conveyed in the direction of the arrow 7, is arranged above the solder container 1. The angle of transport of the conveyor belt 6 is approx. 7° in relation to the horizontal.

A soldering wave 8, which flows against the transport direction according to arrow 7, is generated by means of the soldering nozzle 2. An arc-shaped soldering wave 9, which is directly in the transport direction according to arrow 7, is generated by means of the soldering nozzle 3. A vertically adjustable guiding plate 10 is arranged between the descending areas of the soldering waves 8, 9. It is achieved by means of the opposite soldering waves 8, 9 that the components of a printed circuit board to be soldered together are wetted by liquid solder on all sides, without soldered joints remaining unwetted based on the transport direction of the printed circuit boards according to arrow 7. This is necessary especially for SMD (Surface-Mounted Devices) components.

The soldering nozzle 2 has a wave former 11, which is formed by bent-off or angulated plate parts and a lower guiding plate 13, whose surface passes over into the surface 12 of the sonotrode 5 or of the sonotrodes 5, as is clearly apparent from FIG. 1. The surface 12 of each sonotrode 5 forms a partial area of the surface of the lower guiding plate 13 of the wave former 11 of the soldering nozzle 2, which is designed as a wave soldering nozzle. The length of the surface 12 of the sonotrode 5 in the direction of the soldering wave 8 and the shape of the surface of the sonotrode 5 determine the shape of the soldering wave 8 and its rate of flow. To achieve this, the surface 12 of the sonotrode 5 forms; the essentially horizontal end area of the lower guiding plate 13 of the wave former 11 of the soldering nozzle 2. The surface 12 of the sonotrode 5 is designed inclined by a small angle of about 3° to 4° in relation to the horizontal in the direction of flow of the soldering wave 8 in order thus to influence the flow behavior of the soldering wave 8. The sonotrode 5 consists of hardened steel or titanium, and its surface 12 is wetted with the solder of the soldering wave 8. The sonotrode 5 is located in the immediate area of action of the hot solder of the soldering wave 8 in order to bring the sonotrode 5 to the temperature of the soldering bath and in order not to bring about any cooling of the soldering wave 8 at the sonotrode 5, which results in a uniform temperature of the soldering wave 8.

The surface of the sonotrode 5 is milled and/or ground and is provided with slots or furrows, not shown, for guiding the soldering wave 8, which can, e.g., spread out in the desired manner.

The sonotrode 5, being an essential part of the otherwise commercially available ultrasonic electrode 4, operates at a frequency of 20 to 30 kHz and an amplitude of 2 to 7 μm at a maximum output of 1,500 W per sonotrode, i.e., 6,000 W in the case of four sonotrodes 5. Each specially designed sonotrode is provided with a circular edge 14, which is clamped in support elements 15 that are rigidly screwed to the solder container 1, wherein the mounting point of each sonotrode 5, which [mounting point] is formed by the edge 14 and the support elements 15, is provided in a node of the ultrasonic vibration, so that no ultrasonic vibrations are transmitted from the sonotrode 5 to the support elements 15, which are rigid parts of the container. The surface 12 of each sonotrode 5 has a rectangular cross section, and the sonotrodes 5 are arranged next to each other at closely spaced locations, as is shown in FIG. 2, and the cross section of the sonotrodes 5 is reduced under their surface 12 in a direction at right angles to the transport direction according to arrow 7, as is shown in FIG. 2, and wherein the edges 14 of the sonotrodes 5 are accommodated in the areas of reduced cross section between two mutually abutting sonotrodes 5 in the support elements 15 arranged there.

Flux-free soldering of printed circuit boards guided over the soldering waves 8, 9 of the wave soldering nozzles 2, 3 can be carried out due to the above-described design of the device, wherein the solder of the soldering wave 8 is vibrated by means of the sonotrodes 5, the surfaces 12 of the sonotrodes 5 are directly rinsed by the soldering wave 8, and the printed circuit boards with their soldered joints are guided just above the surfaces 12 of the sonotrodes 5. The entire device is designed as an encapsulated device in a manner not shown more specifically, and it is operated under a protective gas atmosphere, especially a nitrogen atmosphere. Cavitation, i.e., the formation of cavities or air bubbles in the solder, is avoided by the action of the ultrasound on the soldered joints, so that no pretreatment of the soldered joints by applying flux is necessary. The components to be soldered together are brought to the optimal soldering temperature in the area of the sonotrodes 5 by preheating and the preliminary wave formed by the soldering wave 9. A vacuum atmosphere may also be generated instead of the protective gas atmosphere, so that the use of a protective gas is not necessary.

To avoid surface tensions, the ultrasonic vibrations of the sonotrodes 5 may also be switched on at intervals, and very good soldering results are obtained at the soldered joints. The ultrasonic electrodes 4 are operated only when the soldering wave 8 is already flowing.

The second exemplary embodiment of the device is shown in FIG. 3. This comprises a mini-wave for the sectional or area soldering of flat assembly units. A solder container 20 contains the ultrasonic electrode, not shown more specifically, with a sonotrode 21, which is provided with a vertical hole 22 and a horizontal connection hole 23, to which a pump 24, with which the solder can be pumped from the solder container 20 according to the arrows 25, is connected, so that a soldering wave 26 is formed at the solder discharge opening 27 of the hole 22. The solder discharge opening 27 is arranged centrally within a ring nozzle 28, whose angular or circular edge area 29 forms the guide surface for the solder flow to build up the soldering wave. The ring nozzle 28 is an exchangeable component of the sonotrode 21 and is connected to the sonotrode 21 by means of a screw thread 30. The solder being discharged from the solder discharge opening 27 of the ring nozzle 28 is needed as a mini-wave for sectional soldering or unsoldering flat assembly units in the form of printed circuit boards 31, which are held above the ring nozzle 28 in a manipulating mean, not shown more specifically.

I claim:

1. A device for the flux-free soldering of printed circuit boards, comprising:

a wave soldering nozzle with wave forming means for forming a soldering wave;

at least one ultrasonic electrode (sonotrode) for vibrating the solder, said sonotrode having a surface over which said soldering wave passes, said printed circuit board being guided just above a surface of said sonotrode, said sonotrode forming a partial area of said surface of said wave forming means of said wave soldering nozzle.

2. A device according to claim 1, wherein said surface of said sonotrode forms an essentially horizontal end area of a guiding plate of said wave forming means of said wave soldering nozzle.

3. A device according to claim 2, wherein said surface of said sonotrode is formed inclined by an angle with respect to horizontal, at least partially in a direction of flow of said solder.

4. A device according to claim 1, wherein said surface of said sonotrode is provided with slots for guiding said soldering wave.

5. A device according to claim 1, wherein said solder is provided in a solder container, said sonotrode having a mounting point wherein said sonotrode is mounted in said solder container at said mounting point, said mounting point being at a node of an ultrasonic vibration.

6. A device according to claim 5, wherein a plurality of sonotrodes are arranged adjacent to each other over a width of said solder container.

7. A device according to claim 6, wherein said solder is provided in said solder container, said sonotrode having a mounting point wherein said sonotrode is mounted in said solder container at said mounting point, said mounting point being at a node of an ultrasonic vibration said sonotrodes each have a surface which is rectangular in cross section, said sonotrodes being arranged adjacent to each other at closely spaced locations, said sonotrodes having a cross-section which is reduced at an opposite side of said surface, said mounting points of said sonotrodes being accommodated in said areas of reduced cross-section between two mutually abutting sonotrodes.

8. A device according to claim 1, wherein said sonotrodes include switching means for switching ultrasonic vibration of said sonotrodes on at intervals.

9. A device according to claim 1, wherein the surface of said sonotrode forms a guiding surface for solder flow, said solder flowing in a guided manner through said sonotrode.

10. A device according to claim 9, wherein said sonotrode is formed as a ring nozzle with one of an angular or circular edge area defining a solder discharge opening, said edge area forming said guiding surface for solder flow.

11. A device according to claim 10, wherein said ring nozzle is provided as a replaceable part of said sonotrode.

12. A device according to claim 1, wherein said soldering nozzle is disposed in means defining a vacuum atmosphere.

* * * * *